(12) United States Patent
Aliane

(10) Patent No.: US 10,593,857 B2
(45) Date of Patent: *Mar. 17, 2020

(54) PROCESS FOR MANUFACTURING A PYROELECTRIC AND/OR PIEZOELECTRIC DRIVE

(71) Applicant: Commissariat à l'Énergie Atomique et aux Énergies Alternatives, Paris (FR)

(72) Inventor: Abdelkader Aliane, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 640 days.

This patent is subject to a terminal disclaimer.

(21) Appl. No.: 15/033,892

(22) PCT Filed: Oct. 27, 2014

(86) PCT No.: PCT/FR2014/052725
§ 371 (c)(1),
(2) Date: May 2, 2016

(87) PCT Pub. No.: WO2015/071567
PCT Pub. Date: May 21, 2015

(65) Prior Publication Data
US 2016/0276569 A1   Sep. 22, 2016

(30) Foreign Application Priority Data
Nov. 15, 2013   (FR) ...................................... 13 61162

(51) Int. Cl.
*H01L 37/02*   (2006.01)
*H01L 41/45*   (2013.01)
*H01L 41/317*  (2013.01)

(52) U.S. Cl.
CPC .......... *H01L 37/025* (2013.01); *H01L 41/317* (2013.01); *H01L 41/45* (2013.01)

(58) Field of Classification Search
CPC ...... H01L 37/025; H01L 41/317; H01L 41/45
See application file for complete search history.

(56) References Cited

U.S. PATENT DOCUMENTS

2009/0306264 A1   12/2009   Koh et al.
2017/0114241 A1*  4/2017   Almadhoun ............. H01G 7/06

FOREIGN PATENT DOCUMENTS

KR   20090030825 A   3/2009
KR   20100046641 A   5/2010
WO   WO 2005/064653 A1   7/2005

OTHER PUBLICATIONS

Written Opinion, dated Jan. 20, 2015, from corresponding International Application No. PCT/FR2014/052725.

(Continued)

*Primary Examiner* — Robert S Walter, Jr.
(74) *Attorney, Agent, or Firm* — Wolf, Greenfield & Sacks, P.C.

(57) ABSTRACT

A process for manufacturing a piezoelectric and/or pyroelectric device comprising a polyvinylidene fluoride film, the process comprising a step of forming at least one portion of a layer of a solution comprising a solvent and a compound comprising polyvinylidene fluoride and a step of irradiating the portion with pulses of at least one ultraviolet radiation. The irradiating step enables the formation of at least two β crystalline phases having different orientations.

9 Claims, 2 Drawing Sheets

(56) References Cited

OTHER PUBLICATIONS

International Search Report, dated Jan. 20, 2015, from International Application No. PCT/FR2014/052725.
Da Silva et al.: "Effect of drawing on dielectric properties and polarization of pressed solution cast β-PVDF films," (2010) J. Mater. Sci.; pp: 4206-4215.

* cited by examiner

PROCESS FOR MANUFACTURING A PYROELECTRIC AND/OR PIEZOELECTRIC DRIVE

CROSS-REFERENCE TO THE RELATED APPLICATIONS

This application is the national phase of International Application No. PCT/FR2014/052725, filed on Oct. 27, 2014, which claims the priority benefit of French patent application FR13/61162, filed on Nov. 15, 2013, which applications are hereby incorporated by reference to the maximum extent allowable by law.

BACKGROUND

The present application relates to a method of manufacturing a pyroelectric and/or piezoelectric device comprising a film of polyvinylidene fluoride (PVDF) or of a copolymer of PVDF and to a pyroelectric and/or piezoelectric device obtained by such a method.

DISCUSSION OF THE RELATED ART

Pyroelectric and/or piezoelectric device may be used as sensors, for example, as pressure sensors, as switches, or as energy recovery devices. It is known to form a pyroelectric and/or piezoelectric device by using a polymer film of PVDF or of a copolymer of PVDF.

The PVDF polymer and the PVDF copolymers are semi-crystalline polymers which, after the polymerization step, have a crystallinity generally in the range from 50% to 60%. The PVDF polymer or the PVDF copolymer may comprise crystalline phases of three types, $\alpha$, $\beta$, and $\gamma$. Phase $\beta$ may have pyroelectric and piezoelectric properties while phase $\alpha$ has none.

After the polymerization step, the obtained crystalline phase generally mostly is phase $\alpha$. An additional treatment should then generally be provided to at least partly transform phase $\alpha$ into phase $\beta$. The treatment may comprise:

thermally annealing, for example, at a temperature in the range from 110° C. to 170° C. for a time period varying from several minutes to several hours;

mechanically stretching the polymer;

applying to the film an electric field of high intensity for several hours; and/or ionizing the air around the PVDF film.

It may be desirable to form the PVDF or PVDF copolymer film on a substrate of a plastic material, for example, polyethylene naphthalate (PEN) or polyethylene terephthalate (PET). It may further be desirable to form the PVDF or PVDF copolymer film on a substrate also having other electronic components, for example, transistors, formed thereon or therein.

A disadvantage of known methods for obtaining crystalline phase $\beta$ is that they may be incompatible with the use of a plastic substrate or with the forming of electronic components, particularly due to the high temperatures and/or mechanical stress applied.

SUMMARY

An embodiment aims at overcoming the disadvantages of previously-described pyroelectric and/or piezoelectric device manufacturing methods.

Another embodiment aims at the manufacturing of a pyroelectric and/or piezoelectric device comprising a PVDF or PVDF copolymer film on a plastic substrate.

Another embodiment aims at the manufacturing of a pyroelectric and/or piezoelectric device comprising a PVDF or PVDF copolymer film on a substrate also having other electronic components formed thereon or therein.

Another embodiment aims at decreasing the time taken by the manufacturing of a pyroelectric and/or piezoelectric PVDF-based film.

Another embodiment aims at decreasing, or even at suppressing, the substrate heating step.

Thus, an embodiment provides a method of manufacturing a piezoelectric and/or pyroelectric device comprising a film comprising polyvinylidene fluoride and/or at least one copolymer of polyvinylidene fluoride, the method comprising the steps of:

forming at least one portion of a layer of a solution comprising a solvent and a compound comprising polyvinylidene fluoride and/or at least the copolymer of polyvinylidene fluoride; and irradiating at least the portion with pulses of at least one ultraviolet radiation.

According to an embodiment, the compound comprises a polymer selected from the group comprising polyvinylidene fluoride, poly(vinylidene fluoride-trifluoroethylene), poly(vinylidene fluoride-tetrafluoroethylene) and a mixture of at least two of these polymers.

According to an embodiment, the compound further comprises ceramic particles.

According to an embodiment, the duration of each pulse is in the range from 500 µs to 2 ms.

According to an embodiment, the fluence of the ultraviolet radiation is in the range from 10 J/cm$^2$ to 25 J/cm$^2$.

According to an embodiment, the solvent has an evaporation boiling temperature in the range from 110° C. to 140° C.

According to an embodiment, the solution comprises from 80% to 95% wt. of the solvent and from 5% to 20% wt. of the compound.

According to an embodiment, the method further comprises the steps of:

providing a substrate;

depositing on the substrate a coating reflecting the ultraviolet radiation; and forming the film at least partially on the coating.

According to an embodiment, the solvent is capable of at least partially absorbing the ultraviolet radiation.

An embodiment provides a piezoelectric and/or pyroelectric device comprising a film comprising polyvinylidene fluoride and/or at least one copolymer of polyvinylidene fluoride and having two $\beta$ crystalline phases having different directions.

According to an embodiment, the device comprises a substrate having the film formed thereon, made of a polymer having a glass transition temperature lower than or equal to 130° C.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1A:
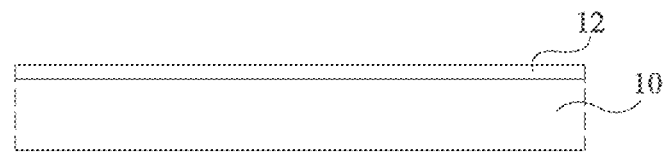
FIGS. 1A to 1D are partial simplified cross-section views of the structures obtained at successive steps of another embodiment of a method of manufacturing a pyroelectric/piezoelectric PVDF or PVDF copolymer device.

For clarity, the same elements have been designated with the same reference numerals in the various drawings and, further, as usual in the representation of electronic circuits, the various drawings are not to scale. Further, only those elements which are useful to the understanding of the present description have been shown and are described. In the following description, unless otherwise indicated, terms "substantially", "approximately", and "in the order of" mean "to within 10%". In the following description, expression "PVDF-based" element means an element comprising at least 70% wt. of the PVDF polymer and/or of at least one copolymer of PVDF.

An embodiment of a method of manufacturing a pyroelectric and/or piezoelectric device comprising a PVDF-based film particularly comprises forming the β crystalline phase which has the desired pyroelectric and/or piezoelectric properties, by applying short pulses of an ultraviolet radiation (UV) to a liquid layer comprising a PVDF-based compound. This enables to heat the liquid phase to favor the forming of crystalline phase β. This enables to locally heat the liquid layer without heating the substrate having the PVDF-based film formed thereon and/or without heating electronic components close to the PVDF-based film.

FIGS. 1A to 1D illustrate an embodiment of a method of manufacturing a pyroelectric and/or piezoelectric device comprising a PVDF-based film.

FIG. 1A is a partial simplified cross-section view of the structure obtained after having formed a first electrode 12 on a substrate 10.

Substrate 10 may be made of an insulating or semiconductor material. As an example, substrate 10 is made of glass, of silicon, or of a plastic material. Substrate 10 may be made of a polymer, for example, polyimide, PEN, or PET. As an example, the thickness of substrate 10 is in the range from 25 μm to 200 μm. Substrate 10 may be flexible.

First electrode 12 is preferably made of a material reflecting ultraviolet radiation, for example, over a wavelength range between 200 nm and 400 nm. It may be a metal layer. As an example, the material forming layer 12 is selected from the group comprising silver (Ag), aluminum (Al), gold (Au), or a mixture or an alloy of two or more than two of these metals. The thickness of layer 12 may be greater than or equal to 30 nm, preferably between 30 nm and 300 nm.

The deposition of first electrode 12 on substrate 10 may be performed by a physical vapor deposition or by printing techniques, particularly by silk screening or by inkjet printing, or by sputtering.

Figure 1B:
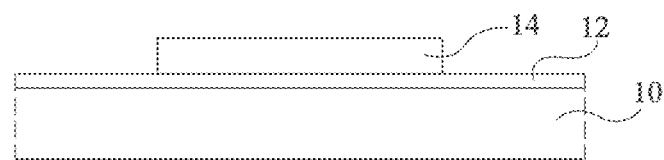

FIG. 1B shows the structure obtained after having deposited a portion of a liquid layer 14, possibly viscous, on first electrode 12. The portion of liquid layer 14 comprises a solvent and a PVDF-based compound dissolved in the solvent. The thickness of portion 14 is in the range from 100 nm to 4 μm.

The PVDF-based compound may comprise the PVDF polymer alone, a single copolymer of PVDF, a mixture of two or more than two PVDF copolymers, a mixture of the PVDF polymer and of at least one PVDF copolymer. Preferably, the PVDF copolymer is poly(vinylidene fluoride-trifluoroethylene) (P(VDF-TrFE)), poly(vinylidene fluoride-tetrafluoroethylene), particularly P(VDFx-TrFE100-x) where x is a real number in the range from 60 to 80, poly(vinylidene fluoride-trifluoroethylene-chloro-fluoroethylene) (P(VDF-TrFE-CFE)), poly(vinylidene fluoride-trifluoroethylene-chlorotrifluoroethylene) (P(VDF-TrFE-CTFE)).

The PVDF-based compound may further comprise fillers. The fillers may correspond to ceramic particles, for example, barium titanium particles (BaPiO3), lead zirconium titanium particles (PbZrTiO3 or PZT), lead titanium particles (PbTiO3), or lithium tantalum particles (LiTaO3). The concentration by weight of fillers in the PVDF-based compound may vary from 5% to 25%.

The compound may thus comprise a mixture of the PVDF polymer and of at least one ceramic or a mixture of at least one PVDF copolymer and of at least one ceramic, for example, the following mixtures: PVDF/BaTiO3, P(VDF-TrFE)/BaTiO3, P(VDF-TrFE-CTFE)/BaTiO3, P(VDF-TrFE-CFE)/BaTiO3, PVDF/PbZrTiO3, P(VDF-TrFE)/PbZrTiO3, P(VDF-TrFE-CTFE)/PbZrTiO3, P(VDF-TrFE-CFE)/PbZrTiO3, PVDF/PbTiO3, P(VDF-TrFE)/PbTiO3, P(VDF-TrFE-CTFE)/PbTiO3, P(VDF-TrFE-CFE)/PbTiO3, PVDF/LiTaO3, P(VDF-TrFE)/LiTaO3, P(VDF-TrFE-CTFE)/LiTaO3, P(VDF-TrFE-CFE)/LiTaO3.

Preferably, the solvent is a polar solvent. This advantageously enables to improve the dissolution of the PVDF-based polymer. Preferably, the solvent is capable of absorbing, at least partially, UV radiation, for example, over a wavelength range between 200 nm and 400 nm. According to an embodiment, the boiling temperature of the solvent is in the range from 110° C. to 140° C., preferably from 110° C. to 130° C., more preferably from 120° C. to 130° C. The solvent may be selected from the group comprising cyclopentanone, dimethylsulphoxide (DMSO), dimethyl-formamide (DMF), dimethylacetamide (DMAc), or N-methyl-E-pyrrolidone (NMP). Preferably, the solvent is cyclopentanone.

Portion 14 comprises from 1% to 30%, preferably from 1% to 20%, by weight of the PVDF-based compound, and from 70% to 99%, preferably from 80% to 99%, by weight of the solvent. Advantageously, the concentration by weight of the solvent is selected to adjust the viscosity of the obtained solution to enable to implement printing techniques. The method of forming liquid layer portion 14 may correspond to a so-called additive process, for example, by direct printing of portion 14 at the desired locations, for example, by inkjet printing, photogravure, silk-screening, flexography, spray coating, or drop casting. The method of forming liquid layer portion 14 may correspond to a so-called subtractive process, where the liquid layer is deposited all over the structure and where the non-used portions are then removed, for example, by photolithography or laser ablation. According to the considered material, the deposition over the entire structure may be performed, for example, by liquid deposition, by cathode sputtering, or by evaporation. Methods such as spin coating, spray coating, heliography, slot-die coating, blade coating, flexography, or silk-screening, may in particular be used.

Figure 1C:
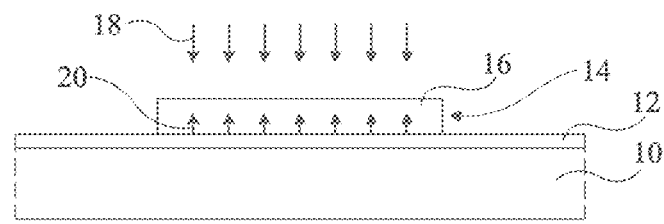

FIG. 1C illustrates a step of irradiating at least part of portion 14, which causes the forming of a PVDF-based film 16 having the desired pyroelectric and/or piezoelectric properties. The UV irradiation is schematically shown in FIG. 1C by arrows 18. The irradiation is carried out by a succession of UV radiation pulses, or ultraviolet flashes. UV radiation means a radiation having its wavelengths at least partly in the range from 200 nm to 400 nm. According to an embodiment, the duration of a UV pulse is in the range from 500 μs to 2 ms. The duration between two successive UV pulses may be in the range from 1 to 5 seconds. The fluence of the (UV) radiation may be in the range from 10 J/cm$^2$ to 25 J/cm$^2$. The number of UV pulses particularly depends on the thickness of portion 14. As an example, for a 100-nm thickness of portion 14, the number of UV pulses may be in the range from 1 to 2 with a fluence between 10 J/cm$^2$ and 15 J/cm$^2$ and for a thickness of portion 14 in the order of 4 μm, the number of UV pulses may be in the range from 2 to 6 with a fluence between 17 J/cm$^2$ and 21 J/cm$^2$.

Advantageously, during the irradiation of portion 14, first electrode 12 reflects a portion of the UV radiation having crossed portion 14. This enables to improve the quantity of UV radiation received by portion 14. The reflection of UV rays is schematically shown in FIG. 1C by arrows 20.

Advantageously, the solvent of liquid layer portion 14 at least partly absorbs the UV radiation. This enables to improve the UV-based heating of the compound and to favor the forming of the β crystalline phase. The boiling temperature of the solvent is advantageously greater than 110° C. to avoid too fast an evaporation of the solvent before the forming of the β crystalline phase, which occurs between 120° C. and 130° C.

Preferably, the irradiation step causes an evaporation of more than 50% by weight, preferably more than 80% by weight, of the solvent of liquid layer portion 14.

Figure 1D:
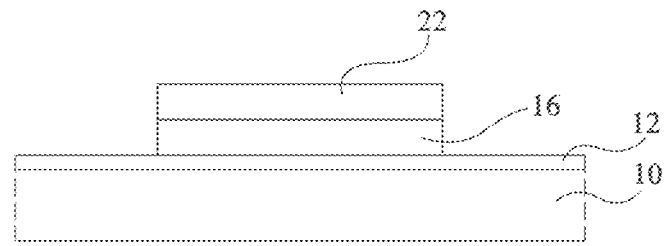

FIG. 1D shows the structure obtained after having deposited a second electrode 22 on film 16. Electrode 22 is for example made of a metallic material selected from the group comprising silver, copper, or a mixture or an alloy of at least two of these materials. According to the considered material, electrode 22 may be deposited by physical vapor deposition (PVD) or by printing techniques, for example, by inkjet or by silk screening. In this case, an anneal step may then be provided, for example, by irradiation of the ink deposited by UV pulses having a fluence between 15 J/cm2 and 25 J/cm2.

A subsequent step of application of an electric field to the structure may be provided. As an example, the electric field may vary between 20 and 80 V/μm and may be applied at a temperature in the range from 70 to 90° C. for from 5 to 10 minutes.

Film 16 obtained by the implementation of the embodiment of the previously-described manufacturing method has pyro-electric and piezoelectric properties.

Figure 2:
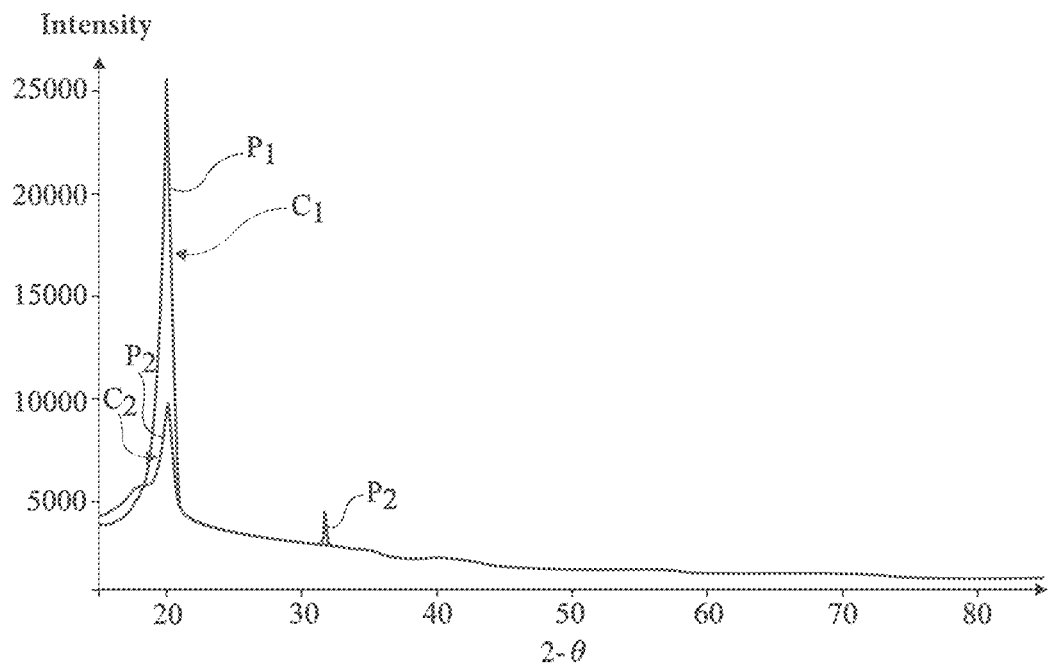
FIG. 2 shows an X ray diffraction diagram obtained for a film of a copolymer of PVDF formed according to a known manufacturing method and of a film of a PVDF copolymer formed according to the embodiment described in relation with FIGS. 1A to 1D.

FIG. 2 shows two diffraction diagrams C1 and C2 respectively of first and second PVDF-based films.

The first piezoelectric film associated with curve C1 has been obtained by forming a layer with a 2-μm thickness by silk screening deposition of a solution comprising 20% wt. of the P(VDF70-TrFe30) copolymer and 80% wt. of cyclopentanone. The solution has been obtained by mixing 2 g of cyclopentanone and 0.4 g of P(VDF70-TrFe30) powder at a temperature in the range from 40 to 45° C. for several hours. The layer has been heated on a heating plate for 5 minutes at 100° C. and for 3 minutes at 130° C.

The second piezoelectric film associated with layer C2 has been obtained by the embodiment of the manufacturing method previously described in relation with FIGS. 1A to 1D, where liquid layer portion 14 has a 2 μm thickness and has been formed by depositing by silk screening a solution comprising 80% wt. of cyclopentanone and 20% wt. of the P(VDF70-TrFe30) copolymer. The solution has been obtained by mixing 0.4 g of P(VDF70-TrFe30) powder with 2 g of cyclopentanone at a temperature in the range from 40 to 45° C. for several hours. The layer has been irradiated by 2 pulses of a UV radiation provided by a UV lamp having a wavelength in the range from 240 nm to 1,000 nm, with more than 75% of the energy between 240 nm and 400 nm. The duration of each pulse was 2 ms. The duration between two successive pulses was 1 second. The fluence of the UV radiation was 21 J/cm$^2$.

Curve C1 comprises a peak P1 for a 2θ1 angle substantially equal to 20°. This indicates the presence of a β crystalline phase in the first film, which is characteristic of pyroelectric/piezoelectric properties.

Curve C2 also comprises a peak P2 for the 2θ1 angle. However, curve C2 further comprises a peak P2 for a 2θ2 angle substantially equal to 32°, more specifically to 31.5° to within 1%. This translates the presence of another β crystalline phase in the second film which has a different direction than the β crystalline phase associated with angle 2θ1. The step of UV flash irradiation enables to form at least two β crystalline phases in the second film.

The inventors have revealed an improvement of the pyroelectric and/or piezoelectric activity of a film obtained by the embodiment of the manufacturing method previously described in relation with FIGS. 1A to 1D over a pyroelectric and/or piezoelectric film obtained by heating.

Figure 3:
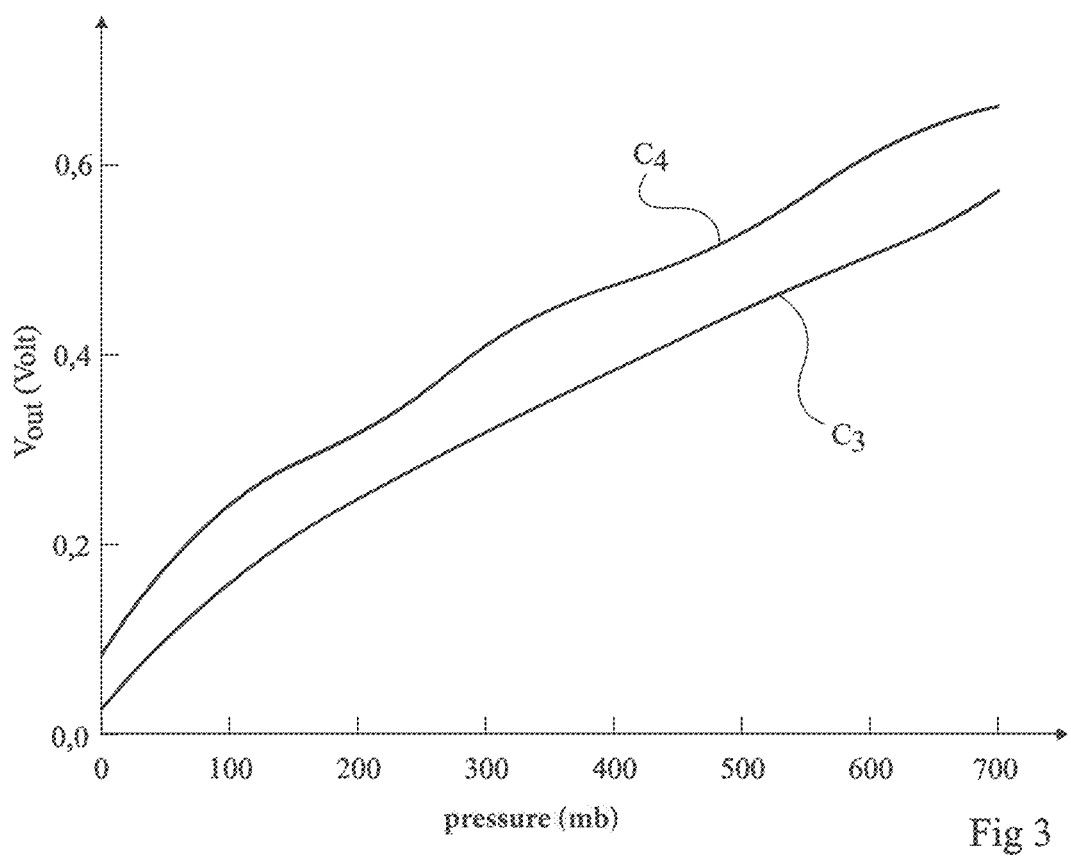
FIG. 3 shows curves of the variation of the voltage obtained across a pyroelectric and/or piezoelectric device according to the pressure applied for a device comprising a PVDF copolymer film formed according to a known manufacturing method and a device comprising a PVDF copolymer film formed according to the embodiment described in relation with FIGS. 1A to 1D.

FIG. 3 shows curves C3 and C4 of the variation of the voltage applied between the terminals of piezoelectric sensors respectively comprising third and fourth PVDF-based films.

The third piezoelectric film associated with curve C3 has been obtained by forming a layer of 2-μm thickness by silk screening of a solution comprising 80% wt. of cyclopentanone and 20% wt. of the P(VDF70-TrFe30) copolymer. The solution has been obtained by mixing 0.4 g of P(VDF70-TrFe30) powder with 2 g of cyclopentanone at a temperature in the range from 40 to 45° C. for several hours. The layer has been heated for 30 minutes at 130° C. after being deposited.

The fourth piezoelectric film associated with layer C4 has been obtained by the embodiment of the manufacturing method previously described in relation with FIGS. 1A to 1D, where liquid layer portion 14 has a 2 μm thickness and has been formed by depositing by silk screening a solution comprising 80% wt. of cyclopentanone and 20% wt. of the P(VDF70-TrFe30) copolymer. The solution has been obtained by mixing 0.4 g of P(VDF70-TrFe30) powder with 2 g of cyclopentanone at a temperature in the range from 40 to 45° C. for several hours. The layer has been irradiated by 4 pulses of a UV radiation provided by a UV lamp having a wavelength in the range from 240 nm to 1,000 nm, with more than 75% of the energy between 240 nm and 400 nm. The duration of each pulse was 1.5 ms. The duration between two successive pulses was 1 second. The fluence of the UV radiation was 17.5 J/cm$^2$.

Curve C4 is located above curve C3. This means that the piezoelectric activity of the sensor comprising the fourth PVDF-based film is greater than the piezoelectric activity of the sensor comprising the third PVDF-based film.

Figure 4:
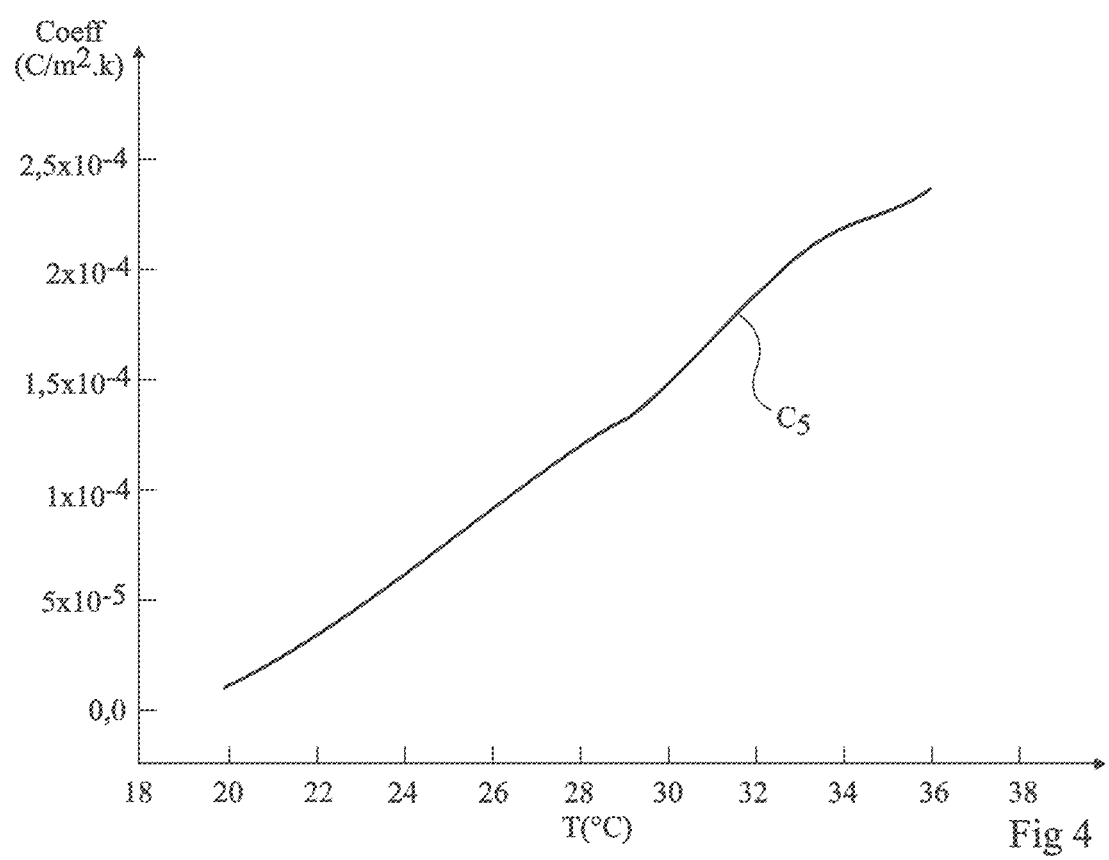
FIG. 4 shows a curve of the variation of the pyroelectric coefficient according to the temperature of a device comprising a PVDF copolymer film formed according to the embodiment described in relation with FIGS. 1A to 1D.

FIG. 4 shows a curve C5 of the variation of pyroelectric coefficient Coeff of a pyroelectric sensor comprising the fourth PVDF-based film. Curve C5 illustrates the pyroelectric activity of the PVDF-based film manufactured according to the embodiment of the manufacturing method previously described in relation with FIGS. 1A to 1D.

An advantage of the embodiment of the pyroelectric and/or piezoelectric manufacturing method is that it has a short duration, in particular shorter than 1 minute. Further, it comprises no step of heating the entire substrate having the PVDF-based film formed thereon at a temperature higher than 130° C. This enables to use a substrate made of plastic material. This further enables to form other electronic components inside and/or on top of the substrate.

An advantage of the embodiment of the pyroelectric and/or piezoelectric device manufacturing method is that the treatment for forming the β crystalline phase, comprising a thermal anneal, the application of mechanical stress, and/or the application of a magnetic field, may be omitted.

Specific embodiments have been described. Various alterations, modifications, and improvements will readily occur to those skilled in the art.

The invention claimed is:

1. A method of manufacturing a piezoelectric and/or pyroelectric device comprising a film comprising poly-vinylidene fluoride and/or at least one copolymer of poly-vinylidene fluoride, the method comprising the steps of:

forming at least one portion of a layer of a solution comprising a solvent and a compound comprising poly-vinylidene fluoride and/or at least the copolymer of poly-vinylidene fluoride;

and irradiating at least the portion with pulses of at least one ultraviolet radiation to provide the film having piezoelectric and/or pyroelectric properties.

2. The method of claim 1, wherein the compound comprises poly-vinylidene fluoride, poly(vinylidene fluoride-trifluoro ethylene), poly(vinylidene fluoride-tetrafluoroethylene) or a mixture of at least two of these polymers.

3. The method of claim 1, wherein the compound further comprises ceramic particles.

4. The method of claim 1, wherein a duration of each pulse is in the range from 500 μs to 2 ms.

5. The method of claim 1, wherein a fluence of the ultraviolet radiation is in the range from 10 J/cm$^2$ to 25 J/cm$^2$.

6. The method of claim 1, wherein the solvent has a boiling temperature in the range from 110° C. to 140° C.

7. The method of claim 1, wherein the solution comprises from 80% to 95% wt. of the solvent and from 5% to 20% wt. of the compound.

8. The method of claim 1, further comprising the steps of:
providing a substrate;
depositing on the substrate a coating reflecting the ultraviolet radiation; and
forming the film at least partially on the coating.

9. The method claim 1, wherein the solvent is capable of at least partially absorbing the ultraviolet radiation.

* * * * *